United States Patent [19]
Grüning

[11] Patent Number: 4,885,657
[45] Date of Patent: Dec. 5, 1989

[54] THYRISTOR WITH TURN-OFF FACILITY AND OVERVOLTAGE PROTECTION

[75] Inventor: Horst Grüning, Baden, Switzerland

[73] Assignee: BBC Brown Boveri AG, Baden, Switzerland

[21] Appl. No.: 288,272

[22] Filed: Dec. 22, 1988

[30] Foreign Application Priority Data

Dec. 23, 1987 [CH] Switzerland ............... 5014/87

[51] Int. Cl.⁴ ................ H02H 3/20; H02H 7/10
[52] U.S. Cl. .................... 361/91; 361/87;
361/13; 307/570; 307/633; 363/57; 357/38
[58] Field of Search ............ 361/2, 6, 7, 8, 13,
361/54, 56, 86, 88, 91, 100, 111; 307/570, 632,
633, 638, 639, 640, 641, 642; 357/38; 363/53,
54, 56, 57

[56] References Cited

U.S. PATENT DOCUMENTS

| | | | |
|---|---|---|---|
| 4,319,318 | 3/1982 | Rippel et al. | 363/57 |
| 4,502,072 | 2/1985 | Herberg | 357/38 |
| 4,697,219 | 9/1987 | Mitsuoka | 363/54 |
| 4,760,431 | 7/1988 | Nakagawa et al. | 357/38 |

FOREIGN PATENT DOCUMENTS

| | | |
|---|---|---|
| 0178387 | 4/1986 | European Pat. Off. . |
| 0209986 | 1/1987 | European Pat. Off. . |
| 0224757 | 6/1987 | European Pat. Off. . |
| 0246478 | 11/1987 | European Pat. Off. . |
| 3425414 | 1/1986 | Fed. Rep. of Germany . |
| 3537419 | 4/1987 | Fed. Rep. of Germany . |
| 2039170 | 7/1980 | United Kingdom ............ 361/91 |

OTHER PUBLICATIONS

SCR Manual, 5th Edition (1972), Issued by General Electric, pp. 156–159.

Primary Examiner—A. D. Pellinen
Assistant Examiner—H. L. Williams
Attorney, Agent, or Firm—Oblon, Spivak, McClelland, Maier & Neustadt

[57] ABSTRACT

In a thyristor with turn-off facility (AT) and overvoltage protection, the voltage limitation is achieved by a parallel-connected controllable resistor, in particular in the form of a J-FET (JF) which is driven by an overvoltage sensor (OS).

The separation of sensor function and bypass function produce advantages for a simple and compact construction.

10 Claims, 2 Drawing Sheets

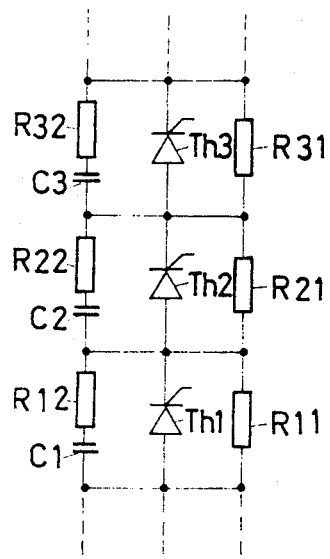
FIG.1A
PRIOR ART
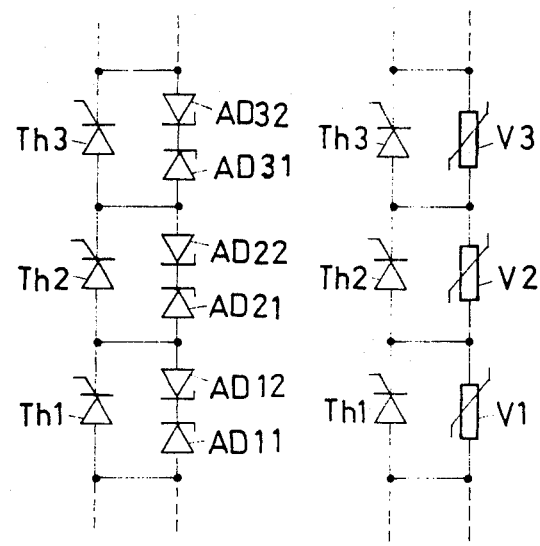
FIG.1B PRIOR ART
FIG.1C PRIOR ART
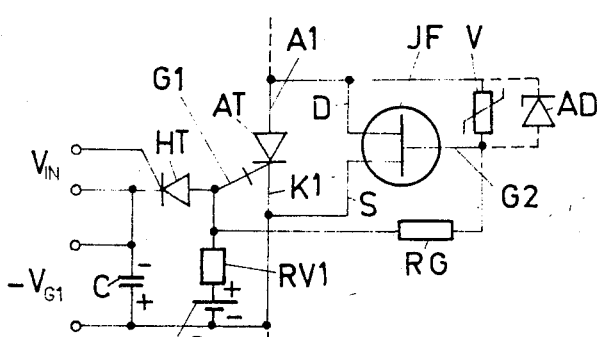
FIG.3A
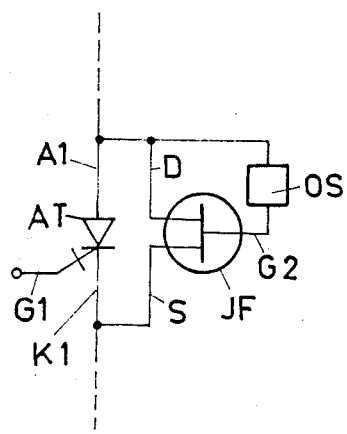
FIG.2
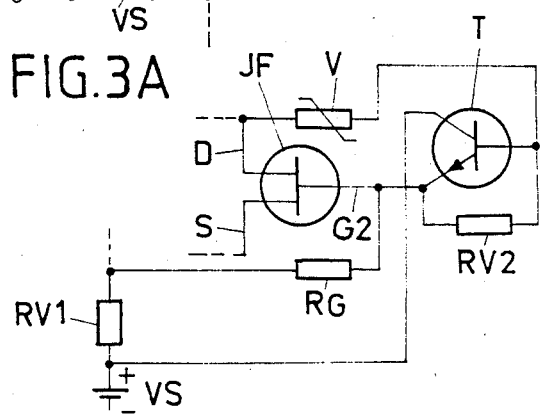
FIG.3B

THYRISTOR WITH TURN-OFF FACILITY AND OVERVOLTAGE PROTECTION

BACKGROUND OF THE INVENTION

1. Field of the Invention

The present invention relates to the field of power semiconductors. It relates specifically to a thyristor with turn-off facility and overvoltage protection, in particular for use in a series circuit of several thyristors, which thyristor with turn-off facility has an anode, a cathode and a gate.

2. Discussion of Background

Whereas operating voltages above 1000 V are rare in the case of the relatively low currents which are switched with IGTS (Insulated -Gate -Transistors) and power MOSFETs, conventional thyristors and thyristors with turn-off facility (for example, GTO thyristors) often operate in networks with a far higher voltage (a few 10 to a few 100 kV).

The thyristors are therefore connected in series. This is possible because the necessary uniform distribution of the total voltage over the individual components can be controlled by simultaneous triggering and a suitable additional circuit.

Such an additional circuit for conventional thyristors is known, for example, from the SCR Manual, 5th edition (1972) issued by General Electric, pages 156–159. It may, on the one hand, be constructed as a so-called "snubber[ circuit consisting of passive components such as resistors and capacitors (FIG. 6.7 therein).

On the other hand, it may, however, also comprise active components such as varistors or avalanche diodes (FIG. 6.9), which become conducting above a critical voltage and consequently provide an active overvoltage protection.

The provision is furthermore known (EP-A No. 2-0,209,986) of an avalanche zone, which triggers at a critical voltage and switches the thyristor section on via its gate, as an over-voltage protection in a conventional thyristor having an "amplifying gate" inside the substrate. In this case, however, the disadvantage is that the thyristor itself is used to reduce the overvoltage, that is to say, there is no protection mechanism which is independent of the thyristor.

Whereas the overvoltage protection described has proved successful in the conventional thyristors without turn-off facility, new problems are encountered in thyristors with turn-off facility (GTO thyristors and FCThs =-Field -Controlled -Thyristors).

GTOs and FCThs are intended to operate at relatively high frequency. Their instant of switch-off is considerably dependent on the triggering, owing to the storage time specific to these thyristors. At the same time, the spread in the magnitude of the stored charge in the individual components is at least just as considerable as in conventional thyristors. This has the consequence that a suitable snubber circuit would have to be designed for very high power, which would result in a disproportionately high power loss.

For this reason, in thyristors with turn-off facility only an active overvoltage protection in the form of a bypass device (varistor or avalanche diode) is suitable. Despite the short switching times, especially of FCThs, such bypass devices have to be designed for very high powers: 4 kV clamping voltage, 1000 A switch-off current, 2 kHz repetition frequency and 0.3 microseconds' loading of the bypass device per cycle result in a power loss of 2.4 kW per bypass device.

Avalanche diodes for such loadings are, however, unknown. ZnO varistors are also unable to dissipate much over 200 W power owing to their low thermal conductivity (of the ceramic) the encapsulation and cooling of such components being about equally as expensive as that of high-power thyristors.

SUMMARY OF THE INVENTION

Accordingly, one object of this invention is to provide a thyristor with turn-off facility and overvoltage protection which requires comparatively little additional expenditure and which can be achieved with known means.

This object is achieved in a thyristor with turn-off facility of the type mentioned in the introduction, wherein the overvoltage protection comprises a controllable resistor and an overvoltage sensor;

the controllable resistor is connected in parallel with the thyristor with turn-off facility between its anode and its cathode; and it is driven by the overvoltage sensor.

The essence of the invention therefore is not to use a single component with high power handling capacity for overvoltage detection and voltage limitation, but to carry out the overvoltage detection with an overvoltage sensor having low power handling capacity and to drive with said sensor a regulable resistor with higher loading capability which can be ideally matched to the requirements.

According to a particularly preferred exemplary embodiment of the invention, the thyristor with turn-off facility is an, FCTh, the controllable resistor is a J-FET, and both are integrated alongside each other on a common substrate.

As a result of this, an extremely compact component can be achieved which requires no additional expenditure in relation to housing and cooling for the overvoltage protection.

The overvoltage sensor may in this case be a varistor or an avalanche diode which can also be additionally integrated into the substrate.

Further exemplary embodiments emerge from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A–C show various possibilities for passive and active overvoltage limitation in conventional thyristors according to the prior art;

FIG. 2 hows the basic circuit of a J-FET over-voltage voltage protection for a thyristor with turn-off facility according to a preferred exemplary embodiment of the invention;

FIG. 3A shows a complete thyristor stage with thyristor cascade and overvoltage protection according to the invention;

FIG. 3B shows a thyristor stage corresponding to FIG. 3A with additional amplification between the overvoltage sensor and the regulable resistor.

DESCRIPTION OF THE PREFERRED EMBODIMENTS

Figure 4:
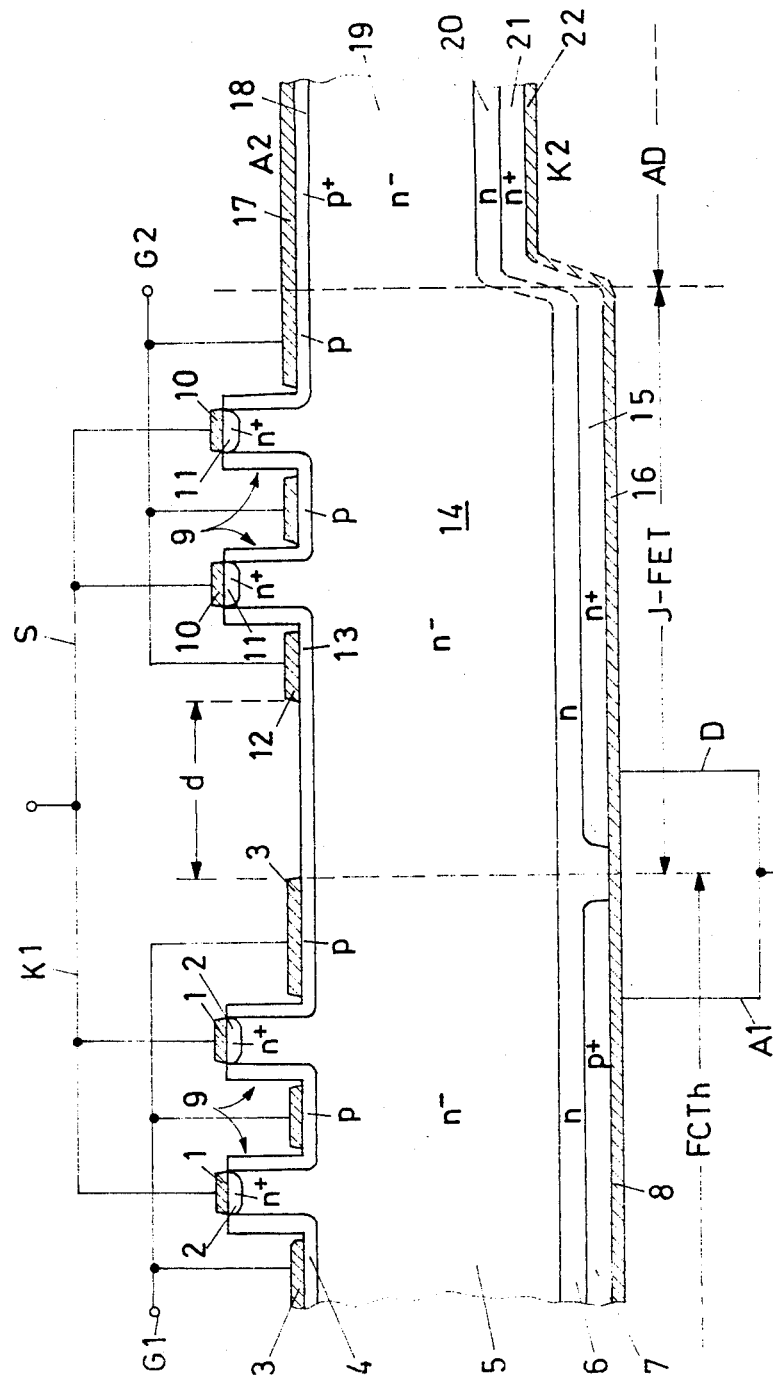
FIG. 4 shows the exemplary embodiment of an FCTh with integrated J-FET and integrated avalanche diode.

Referring now to the drawings, wherein like reference numerals designate identical or corresponding parts throughout the several views, FIGS. 1A-C show various types of overvoltage protection for conventional thyristors connected in series, as they are known from the prior art.

FIG. 1A specifically shows a passive snubber circuit in which combinations of resistors R11-R32 and capacitors C1-C3 are connected in parallel with each of the thyristors Th1-Th3.

FIG. 1B shows a first version of an active overvoltage protection in which a pair of oppositely arranged avalanche diodes AD11, 12 or AD21, 22 or AD31, 32 respectively is connected in parallel with each of the thyristors Th1-Th3.

Finally, FIG. 1C shows a second version of an active overvoltage protection in which varistors V1-V3 are provided instead of the avalanche diodes AD11-AD32.

As already mentioned in the introduction, these known overvoltage protection circuits can be achieved without problems for conventional thyristors because, in that case, very much lower power loss occurs owing to the relatively low switching frequencies.

In thyristors with turn-off facility (GTO thyristors and FCThs) with their higher operating frequencies, the invention takes a completely different path: a controllable resistor which is driven by an overvoltage sensor OS is connected in parallel (FIG. 2) with the thyristor with turn-off facility (AT) between its anode A1 and its cathode K1.

The overvoltage sensor OS detects the overvoltage condition across the thyristor with turn-off facility (AT) and then drives the controllable resistor so that the overvoltage is removed via it.

In the exemplary embodiment of FIG. 2, the controllable resistor is a J-FET (JF) whose source S is connected to the cathode K1 and whose drain D is connected to the anode A1 of the thyristor with turn-off facility (AT).

Since in this case, in contrast to that of the avalanche diodes and varistors in FIGS. 1B, C, sensor function and bypass function are detected by separate parts of the circuit, the controllable resistor can be ideally designed for the power loss which is to be dissipated.

In particular, when the thyristor with turn-off facility (AT) is an FCTh, the controllable resistor in the form of a J-FET can be integrated directly with the thyristor on a common substrate, it being possible to use the same manufacturing technology and geometry for both components (FIG. 4).

In this connection it may be made clear why the separation, according to the invention, of sensor and bypass function is advantageous: in principle, by analogy to FIG. 1B, an avalanche zone which combines both functions in itself could also be integrated in the thyristor substrate.

In order to be able to dissipate the power loss in the region of several kW, such an integrated avalanche zone would have to have an area of greater than 5 cm$^2$. However, such a large area requires an unachievable homogeneity of the electrical properties in the avalanche zone in order that the entire bypass current is not taken over by only a few points in the zone.

A first exemplary embodiment for a complete thyristor stage with triggering circuit and overvoltage protection according to the invention is shown in FIG. 3A.

On the triggering side, a cascade circuit consisting of the thyristor with turn-off facility (AT) and an auxiliary thyristor HT is provided in this stage. Both thyristors are FCThs.

The triggering circuit furthermore comprises a capacitor C, a series resistor RV1 and a voltage source VS. A gate voltage VG1 is applied to the capacitor C; the auxiliary thyristor is triggered by an input signal $V_{IN}$.

If the FCThs are thyristors which are conducting with a short circuit between gate and cathode (so-called "normally-ON" components), the voltage source is unnecessary; the series resistor RV1 is then directly connected to the cathode K1.

If, on the other hand, the FCThs are of the "normally-OFF" type, the voltage of the voltage source VS is about 5V.

Details of the mode of operation of such a thyristor cascade can be obtained from EP-A No. 2-0,246,478.

The overvoltage protection of the thyristor stage comprises the J-FET (JF) connected in parallel, a varistor V (or an avalanche diode AD) as overvoltage sensor, and a gate resistor RG.

The varistor V is connected between the gate G2 and the drain D of the J-FET and has, for example, a knee voltage of 4 kV. The gate resistor RG connects the gate G2 to the gate G1 of the thyristor with turn-off facility (AT). This has the specific advantage that a simple integration of the overvoltage protection is possible.

Despite the controllable resistor, the varistor V in the circuit according to FIG. 3A still carries a relatively high proportion of the total power loss and the choice must therefore be suitably large.

In order to be able to use a smaller varistor, an additional amplification stage, which, in the example, comprises a transistor T and a second series resistance RV2, is therefore provided in a second exemplary embodiment (FIG. 3B) between the varistor V and the J-FET. With such an additional amplification stage, the varistor V can be designed to be at least ten times smaller. In this circuit, incidentally, the transistor T is supplied by the same voltage source VS as the thyristor cascade HT, AT.

As already remarked, it is of particular advantage to choose an FCTh as thyristor with turn-off facility (AT) and to integrate it according to FIG. 4 (optionally together with an avalanche zone as overvoltage sensor) with the J-FET on a common substrate.

At the same time it should be borne in mind that such an integrated J-FET would be completely unsuitable for switching the load itself precisely because of its high resistance, but that it can readily be correctly dimensioned for overvoltage limitation, as the example below relating to a 4 kV/1000 A FCTh shows:

With a bulk thickness of 300 micrometers and a basic conductivity of the substrate of 400 ohm.cm, a reverse voltage of about 4 kV is achieved. This results in a resistance of 12 ohm for a unipolar FET with an area of 1 cm$^2$.

For 1000 A at 4 kV, 2.5 ohm would be necessary and the area of the FET should therefore be at least 4.8 cm$^2$. This implies a current density of 208 A/cm$^2$ and a power loss of $8.3 \times 10^5$ W/cm$^2$ at 4 kV. Such pulse powers can be coped with in silicon itself over periods of 10 microseconds (in this connection, see: A. Nakagawa et al., IEDM 1986, pages 122–125).

The average power of 2.4 kW assumed in the introduction would mean a power loss of 500 W/cm$^2$, which, even with very good cooling, is probably at the upper limit. However, since a suitable GTO thyristor or FCTh in any case requires an area of at least 20 cm$^2$, the area of the J-FET can be increased somewhat without difficulties.

With this dimensioning, the series connection of two varistors of the type SIOV-S14K680 and SIOV-S14K1000 manufactured by Siemens, for example, is suitable as varistor in a circuit according to FIG. 3A. The voltage at 1 A is then about 4 kV and the capacity 80 pF.

With a (high) estimate of anode voltage slope of 10 kV/microsecond, this results in a displacement current of 0.8 A. The displacement current flows during the discharging of the FCThs and should therefore not result in the J-FET switching on. Added to this is a J-FET gate drain capacitance of about 200 pF, corresponding to a displacement current of 2A. The response sensitivity of the J-FET therefore has to be correspondingly reduced by the gate resistor RG.

With a response threshold of 4 A, a power loss of 9.6 W, which can readily be dissipated by direct cooling, results in the varistors with a repetition frequency of 2 kHz and 0.3 microseconds loading per cycle.

The integration of FCTh and J-FET (and additionally of an avalanche zone or avalanche diode) will now be explained using the exemplary embodiment of FIG. 4 in which part of a corresponding substrate is shown in cross section.

The substrate is subdivided laterally into three regions. Arranged in the left-hand region is the FCTh structure, in the center region the J-FET structure, and in the right-hand region the avalanche diode structure (AD).

The FCTh structure is of the "recessed-gate" type having a stepped gate-cathode structure which comprises a multiplicity of control fingers 9 separated by trenches. Such an FCTh is known, for example from EP-A No. 2-0,178,387.

The FCTh structure comprises, between the anode A1 and the cathode K1, a layer sequence composed of a p$^+$-doped anode zone 7, an n$^-$-doped channel layer 5, a p-doped gate zone 4 and n+-doped cathode regions 2.

The cathode regions 2 are arranged on the top of the control fingers 9. The channel layer 5 extends into these control fingers 9 and adjoins there the cathode regions 2. The gate zone 4 extends in each case over the floor and walls of the trenches and forms, together with the channel layer 5 extending in the control finger, a field-effect controllable long channel.

The gate zone 4 is provided with gate contacts 3 on the trench floors, and the cathode regions 2 on the control fingers 9 with corresponding cathode contacts 1. On the anode side, a large-area anode contact 8 produces the electrical connection to the anode zone 7.

The J-FET structure in the center region of the substrate is comparable in structure and geometry to the adjacent FCTh structure, with the difference that, in this case, an n+-doped drain zone 15 replaces the p+-doped anode zone 7.

Both the gate zone 4 and the cathode regions 2, and also the channel layer 5 and the anode contact 8 of the FCTh continue unchanged in the J-FET region as gate zone 13, source regions 11, channel layer 14 and drain contact 16 of the J-FET.

The same applies to an additional n-doped buffer layer 6 which extends underneath the channel layers 5, 14 and separates the anode zone 7 and drain zone 15 from each other and from said channel layers.

As a result of forming the anode contact 8 and the drain contact 16 as a continuous metallization layer, the drain D of the J-FET is connected to the anode A1 of the FCTh.

Correspondingly, as indicated diagrammatically in FIG. 4, the cathode contact 1 and the source contact 10 can be led together to a common connection. The source S of the J-FET is then connected to the cathode K1 of the FCTh.

The situation is different in the gate region: as can be seen from FIG. 3A, the gate G2 of the J-FET is connected to the gate G1 of the FCTh via the gate resistor RG. This gate resistor RG is expediently achieved in that the gate contacts 3 and 12 of the FCTh and J-FET respectively, which are situated per se at the same level, are not constructed as a continuous metallization layer but have a gap with a suitably chosen distance d between them. The part of the gate zone 4, 13 below this gap then forms the required gate resistor RG.

As an example of a suitable gate resistor, the following parameters may be mentioned here:
p-doping (4, 13): $1 \times 10^{17} cm^{-3}$
Thickness of the gate zone (4, 13): 10 micrometers
Edge length between FCTh and J-FET: 100 mm
for RG=5 ohm, d=1.25 mm If an avalanche diode AD is provided as overvoltage sensor instead of an external varistor V, this diode can also be integrated additionally in the substrate in the form of an avalanche zone, as FIG. 4 (right-hand region) shows.

The diode structure comprises a sequence of four zones 18, 19, 20, and 21 between anode A2 and cathode K2 and the corresponding anode and cathode contacts 17 and 22 respectively.

The first zone 18 is p+-doped and a continuation of the gate zone 13 of the adjacent J-FET.

The second zone 19 is n$^-$-doped and a continuation of the channel layer 14, but with reduced thickness in order to achieve suitable breakdown voltages.

The third zone 20 is n-doped and a direct continuation of the buffer layer 6.

Finally, the fourth zone 21 is n+-doped and a direct continuation of the drain zone 15.

Both the anode contact 17 and also the cathode contact 22 are each continuations of the gate contact 12 or the drain contact 16 respectively.

In this manner, the required connection of FCTh, J-FET and AD according to FIG. 3A is achieved with the simplest means.

All in all, the thyristor with turn-off facility according to the invention makes available an overvoltage-protective component which can be achieved with low expenditure, is compactly constructed and can easily be integrated.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A thyristor with turn-off facility and overvoltage protection, in particular for use in a series circuit of several thyristors, which thryistor with turn-off facility has an anode, a cathode and a gate, wherein
   (a) the overvoltage protection comprises a controllable resistor and an overvoltage sensor which monitors the voltage across the thyristor with turn-off facility;
   (b) the controllable resistor is connected in parallel with the thyristor with turn-off facility between its anode and its cathode; and
   (c) it is driven by the overvoltage sensor when the voltage across the thyristor with turn-off facility exceeds a predetermined limit.

2. The thyristor with turn-off facility as claimed in claim 1, wherein
   (a) the controllable resistor is a J-FET;
   (b) the J-FET is connected by its drain to the anode and by its source to the cathode of the thyristor with turn-off facility; and
   (c) the overvoltage sensor is arranged between drain and gate of the J-FET.

3. The thyristor with turn-off facility as claimed in claim 2, wherein the overvoltage sensor is a varistor or an avalanche diode.

4. The thyristor with turn-off facility as claimed in claim 3, wherein a GTO thyristor is used as thyristor with turn-off facility.

5. The thyristor with turn-off facility as claimed in claim 3, wherein a field-controlled thyristor FCTh is used as thyristor with turn-off facility.

6. The thyristor with turn-off facility as claimed in claim 5, wherein the FCTh and the J-FET are integrated alongside each other on a common substrate.

7. A thyristor with turn-off facility and overvoltage protection, in particular for use in a series circuit of several thyristors, which thyristor with turn-off facility has an anode, a cathode and a gate, wherein
   (a) the overvoltage protection comprises a controllable resistor and an overvoltage sensor;
   (b) the controllable resistor comprises a J-FET connected in parallel with the thyristor with turn-off facility between its anode and its cathode, said J-FET connected by its drain to the anode and by its source to the cathode of the thyristor with turn-off facility;
   (c) said J-FET is driven by the overvoltage sensor which is arranged between the drain and gate of the J-FET;
   (d) said thyristor with turn-off facility comprises a field-controlled thyristor FCTh which is integrated alongside said J-FET on a common substrate;
   (e) the FCTh comprises, between the anode and the cathode, a layer sequence composed of a p+ -doped anode zone, an n− -doped channel layer, a p-doped gate zone and n+ -doped cathode regions, the cathode regions being arranged on the top of control fingers separated by trenches, the channel layer extending into the control fingers up to the cathode regions, and the gate zone being embedded in the floors and walls of the trenches;
   (f) the J-FET comprises, between the drain and the source, a layer sequence composed of an n-doped drain zone, an n− -doped channel layer, a p-doped gate zone and n+ -doped source regions, the source regions being arranged on the top of control fingers separated by trenches, the channel layers extending into the control fingers up to the source regions, and the gate zone being embedded in the floors and walls of the trenches;
   (g) in the FCTh, cathode contacts are arranged over the cathode regions, gate contacts on the trench floors, and an anode contact on the anode zone; and
   (h) in the J-FET, source contacts are arranged over the source regions, gate contacts on the trench floors, and a drain contact on the drain zone.

8. The thyristor with turn-off facility as claimed in claim 7, wherein
   (a) the gate zones and the channel layers of the FCTh and J-FET respectively are bounded regions of a common gate zone or channel layer respectively extending through the substrate; and
   (b) the anode contact of the FCTh and the drain contact of the J-FET are bounded regions of a common metallization layer extending over the substrate.

9. The thyristor with turn-off facility as claimed in claim 8, wherein there is arranged, beneath the common channel layer, an n-doped buffer layer which extends through the substrate and which separates the anode zone and the drain zone from each other and from the respective channel layer.

10. The thyristor with turn-off facility as claimed in claim 9, wherein
    (a) the overvoltage sensor is an avalanche diode
    (b) the avalanche diode is also integrated alongside the J-FET on the common substrate;
    (c) the avalanche diode has an anode and a cathode and also an anode contact on the anode side and a cathode contact on the cathode side;
    (d) a sequence of four zones is arranged between the anode contact and the cathode contact;
    (e) the first zone is p+ -doped and a continuation of the common gate zone, the second zone is n− -doped and a continuation of the common channel layer with reduced thickness, the third zone is n-doped and a continuation of the common buffer layer, and the fourth zone is n+ -doped and a continuation of the drain zone; and
    (f) the anode contact is a continuation of the gate contact of the J-FET, and the cathode contact is a continuation of the drain contact of the J-FET.

* * * * *